(12) United States Patent
Shimazawa et al.

(10) Patent No.: US 6,473,257 B1
(45) Date of Patent: Oct. 29, 2002

(54) METHOD AND APPARATUS FOR MEASURING CHARACTERISTICS OF FERROMAGNETIC TUNNEL MAGNETORESISTANCE EFFECT ELEMENT, AND HARD DISK DRIVE

(75) Inventors: Koji Shimazawa; Satoru Araki; Haruyuki Morita, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/542,996

(22) Filed: Apr. 4, 2000

(30) Foreign Application Priority Data

Jul. 12, 1999 (JP) .......................................... 11-196959

(51) Int. Cl.$^7$ ................................................ G11B 5/03
(52) U.S. Cl. ..................................... 360/66; 360/324.2
(58) Field of Search ........................... 360/66, 131, 25, 360/31, 324.2; 324/210, 212

(56) References Cited

U.S. PATENT DOCUMENTS

| | | | | |
|---|---|---|---|---|
| 4,679,107 A | * | 7/1987 | Imakoshi et al. ............ 324/252 |
| 5,790,334 A | * | 8/1998 | Cunningham ................. 360/66 |
| 5,986,839 A | * | 11/1999 | Klaassen et al. .............. 360/66 |
| 6,067,200 A | * | 5/2000 | Ohba et al. .................... 360/66 |
| 6,069,761 A | * | 5/2000 | Stupp ........................... 360/25 |
| 6,134,060 A | * | 10/2000 | Ryat .............................. 360/46 |

* cited by examiner

Primary Examiner—David Hudspeth
Assistant Examiner—Varsha A. Kapadia
(74) Attorney, Agent, or Firm—Oblon, Spivak, McClelland, Maier & Neustadt, P.C.

(57) ABSTRACT

The present invention relates to a method for measuring characteristics of a tunnel magnetoresistance effect element having a tunnel multilayered film comprising a tunnel barrier layer and a first and a second ferromagnetic layer formed to sandwich the tunnel barrier layer therebetween. This method comprises the steps of setting an initial current value $I_0$ which does not destroy the element to be measured, measuring, using the current value $I_0$, a first resistance value R1 as an approximate resistance value of the element, defining, based on the first resistance value R1 and a voltage value Vs which is a measurement standard for the element, an inspection current value Is (Is=Vs/R1), and measuring characteristics of the element using the inspection current value Is. Therefore, "without damaging or destroying elements" and "in an effective way", the characteristics of the element can be measured.

12 Claims, 12 Drawing Sheets

TWO FERROMAGNETIC LAYERS BEING PARALLEL IN MAGNETIZATION

TWO FERROMAGNETIC LAYERS BEING ANTIPARALLEL IN MAGNETIZATION

FIG. 4

FIRST EMBODIMENT

Step I-1: SET INITIAL CURRENT VALUE $I_0$ (e.g. $I_0 = 2.3mA$)

Step I-2: SUPPLY $I_0$ TO MEASURE APPROXIMATE FIRST RESISTANCE VALUE R1 AND, USING R1, DERIVE INSPECTION CURRENT VALUE $I_s$ ($I_s = V_s / R1$)

Step I-3: MEASURE CHARACTERISTICS OF ELEMENT USING INSPECTION CURRENT VALUE $I_s$

THIRD EMBODIMENT

FOURTH EMBODIMENT

METHOD AND APPARATUS FOR MEASURING CHARACTERISTICS OF FERROMAGNETIC TUNNEL MAGNETORESISTANCE EFFECT ELEMENT, AND HARD DISK DRIVE

BACKGROUND OF THE INVENTION

1. Field of the Invention

The present invention mainly relates to a method and apparatus for measuring characteristics of a ferromagnetic tunnel magnetoresistance effect element. The ferromagnetic tunnel magnetoresistance effect element is, among magnetoresistance effect films for reading the magnetic field intensity of a magnetic recording medium or the like as a signal, an element which is capable of reading a small magnetic field change as a greater electrical resistance change signal. The ferromagnetic tunnel magnetoresistance effect element is mainly installed in, for example, a hard disk drive.

2. Description of the Related Art

Following the high densification of hard disks (HD), highly sensitive magnetic heads with high outputs have been demanded. In response to these demands, attention has been paid to a ferromagnetic tunnel magnetoresistance effect element having a multilayered structure composed of ferromagnetic layer/tunnel barrier layer/ferromagnetic layer, which utilizes a ferromagnetic tunnel magnetoresistance effect.

The ferromagnetic tunnel magnetoresistance effect is a phenomenon that when a current is applied in a laminate direction between a pair of ferromagnetic layers which sandwich a tunnel barrier layer, a tunnel current flowing in the tunnel barrier layer changes depending on a relative angle of magnetization between both ferromagnetic layers.

In this case, the tunnel barrier layer is a thin insulation film which allows electrons to pass therethrough while keeping spins of the electrons due to the tunnel magnetoresistance effect. Generally, the tunnel barrier layer is obtained by oxidizing a thin metal, such as Al, layer of about 10 Å in thickness.

When the relative angle of magnetization between both ferromagnetic layers which sandwich the tunnel barrier layer therebetween is decreased, the tunneling probability is increased and, therefore, the resistance to current flowing therebetween is decreased. In contrast, when the relative angle of magnetization between both ferromagnetic layers is large, the tunneling probability is lowered, thus, the resistance to current flowing therebetween is increased.

When applying the TMR element to a HDD head, it is essential to lower the electrical resistance of the element. The reason is as follows: Specifically, the resistance of a TMR element is basically expressed by the following equation (1).

$$R_\sigma = C_o exp(2\kappa d) \kappa = (2m\,\phi/h^2)^{1/2} \quad (1)$$

wherein d represents a thickness of a barrier, $\phi$ represents a magnitude of a barrier potential measured from the Fermi level, and $C_{94}$ represents an amount determined by an electron state of an insulation layer and magnetic layers, and may be considered to be an amount which is approximately proportional to the product of the Fermi levels of the two magnetic layers.

According to the foregoing equation (1), it is understood that lowering of the resistance of the element can be achieved by reducing the thickness d of the barrier. By reducing the resistance of the element, a larger current is allowed to supply, thus, a greater output can be achieved. In addition, in order to prevent the electrostatic discharges, it is desirable to lower the resistance of the element.

In the TMR element, the resistance value drastically varies depending of the thickness d of the barrier layer. For example, when the thickness d of the barrier layer varies about ±1 Å, the order of the resistance value may vary about 1 figure, and in the worst case, dispersion among the resistance values of the TMR elements may be in the range of about 1 to 100 Ω due to small dispersion in thicknesses of the barrier layers during the layer forming process.

Under these circumstances, for example, in a conventional method for measuring electromagnetic transduction characteristics using a constant measuring current on the order of 10 mA, some TMR elements, particularly having high resistances (Ω), are subjected to extremely high voltages. As a result, the original characteristics of these TMR elements may be degraded or the elements may be destroyed.

The present invention has been made under these circumstances and has an object to provide a method and an apparatus for measuring characteristics of a tunnel magnetoresistance effect element without degrading the original characteristics of the element or destroying the element, and has a further object to provide a hard disk drive.

The TMR characteristics such as the TMR ratio and the resistance value vary depending on the magnitude of the voltage applied to the element. Therefore, when measuring characteristics of TMR elements having a broad resistance value distribution caused by small dispersion in production thereof, it is desirable to independently supply sense currents for applying the constant voltage to all the elements. In this event, it is required to provide a method and an apparatus for measuring characteristics of a tunnel magnetoresistance effect element and a hard disk drive which can provide a current for applying a given voltage "without damaging or destroying elements" and "in an effective way".

SUMMARY OF THE INVENTION

For solving the foregoing problems, according to one aspect of the present invention, there is provided a method for measuring characteristics of a tunnel magnetoresistance effect element having a tunnel multilayered film comprising a tunnel barrier layer and a first and a second ferromagnetic layer formed to sandwich the tunnel barrier layer therebetween, wherein the method comprising the steps of:

setting an initial current value $I_0$ which does not destroy the element to be measured;

measuring, using the current value $I_0$, a first resistance value R1 as an approximate resistance value of the element, and defining, based on the first resistance value R1 and a voltage value Vs which is a measurement standard for the element, an inspection current value Is (Is=Vs/R1); and measuring the characteristics of the element using the inspection current value Is.

According to another aspect of the present invention, there is provided a method for measuring characteristics of a tunnel magnetoresistance effect element having a tunnel multilayered film comprising a tunnel barrier layer and a first and a second ferromagnetic layer formed to sandwich the tunnel barrier layer therebetween, wherein the method comprising the steps of:

setting an initial current value $I_0$ which does not destroy the element to be measured;

measuring, using the initial current value $I_0$, a first resistance value R1 as an approximate resistance value of the element, and defining, based on the first resistance value R1 and a voltage value Vs which is a measurement standard for the element, a first modified current value $I_1$ ($I_1=Vs/R1$);

measuring, using the first modified current value $I_1$, a second resistance value R2 as an approximate resistance value of the element, and defining, based on the second resistance value R2 and the voltage value Vs which is the measurement standard for the element, an inspection current value Is (Is=Vs/R2); and measuring the characteristics of the element using the inspection current value Is.

According to another aspect of the present invention, there is provided a method for measuring characteristics of a tunnel magnetoresistance effect element having a tunnel multilayered film comprising a tunnel barrier layer and a first and a second ferromagnetic layer formed to sandwich the tunnel barrier layer therebetween, wherein the method comprising the steps of:

setting an initial current value $I_0$ which does not destroy the element to be measured;

measuring, using the initial current value $I_0$, a first resistance value R1 as an approximate resistance value of the element, and defining, based on the first resistance value R1 and a voltage value Vs which is a measurement standard for the element, a first modified current value $I_1$ ($I_1=Vs/R1$);

measuring, using the first modified current value $I_1$, a second resistance value R2 as an approximate resistance value of the element, and defining, based on the second resistance value R2 and the voltage value Vs which is the measurement standard for the element, a second modified current value $I_2$ ($I_2=Vs/R2$);

measuring, using the second modified current value $I_2$, a third resistance value R3 as an approximate resistance value of the element, and defining, based on the third resistance value R3 and the voltage value Vs which is the measurement standard for the element, an inspection current value Is (Is=Vs/R3); and measuring the characteristics of the element using the inspection current value Is.

According to another aspect of the present invention, there is provided a method for measuring characteristics of a tunnel magnetoresistance effect element having a tunnel multilayered film comprising a tunnel barrier layer and a first and a second ferromagnetic layer formed to sandwich the tunnel barrier layer therebetween, wherein the method comprising the steps of:

(1) setting an initial current value $I_0$ which does not destroy the element to be measured;

(2) measuring, using the initial current value $I_0$, a first resistance value R1 as an approximate resistance value of the element, and defining, based on the first resistance value R1 and a voltage value Vs which is a measurement standard for the element, a first modified current value $I_1$ ($I_1=Vs/R1$);

(3) measuring, using the first modified current value $I_1$, a second resistance value R2 as an approximate resistance value of the element, and defining, based on the second resistance value R2 and the voltage value Vs which is the measurement standard for the element, a second modified current value $I_2$ ($I_2=Vs/R2$);

(4) measuring, using the second modified current value $I_2$, a third resistance value R3 as an approximate resistance value of the element, and defining, based on the third resistance value R3 and the voltage value Vs which is the measurement standard for the element, a third modified value $I_3$ ($I_3=Vs/R3$)

(5) repeating a step which is substantially identical to the step (4) so as to measure, using a $n^{th}$ modified current value $I_n$ (wherein n is an integer greater than or equal to 4), a $(n+1)^{th}$ resistance value Rn+1 as an approximate resistance value of the element, and defining, based on the $(n+1)^{th}$ resistance value Rn+1 and the voltage value Vs which is the measurement standard for the element, an inspection current value Is (Is=Vs/Rn+1); and (6) measuring the characteristics of the element using the inspection current value Is.

It is preferable that the initial current value $I_0$ is set to be in the range of 1 $\mu$A to 2.3 mA.

According to another aspect of the present invention, there is provided an apparatus for measuring characteristics of a tunnel magnetoresistance effect element having a tunnel multilayered film comprising a tunnel barrier layer and a first and a second ferromagnetic layer formed to sandwich the tunnel barrier layer therebetween, the apparatus having a processing circuit which is capable of measuring characteristics of the element while supplying a sense current in a lamination direction of the tunnel multilayered film for applying a given voltage, wherein the processing circuit measures, using an initial current value $I_0$ which is set not to destroy the element to be measured, a first resistance value R1 as an approximate resistance value of the element, defines, based on the first resistance value R1 and a voltage value Vs which is a measurement standard for the element, an inspection current value Is (Is=Vs/R1), and measures characteristics of the element using the inspection current value Is.

According to another aspect of the present invention, there is provided an apparatus for measuring characteristics of a tunnel magnetoresistance effect element having a tunnel multilayered film comprising a tunnel barrier layer and a first and a second ferromagnetic layer formed to sandwich the tunnel barrier layer therebetween, the apparatus having a processing circuit which is capable of measuring characteristics of the element while supplying a sense current in a lamination direction of the tunnel multilayered film for applying a given voltage, wherein the processing circuit measures, using an initial current value $I_0$ which is set not to destroy the element to be measured, a first resistance value R1 as an approximate resistance value of the element, and defines, based on the first resistance value RI and a voltage value Vs which is a measurement standard for the element, a first modified current value $I_1$ ($I_1=Vs/R1$);

measures, using the first modified current value $I_1$, a second resistance value R2 as an approximate resistance value of the element, and defines, based on the second resistance value R2 and the voltage value Vs which is the measurement standard for the element, an inspection current value Is (Is=Vs/R2); and measures the characteristics of the element using the inspection current value Is.

According to another aspect of the present invention, there is provided an apparatus for measuring characteristics of a tunnel magnetoresistance effect element having a tunnel multilayered film comprising a tunnel barrier layer and a first and a second ferromagnetic layer formed to sandwich the tunnel barrier layer therebetween, the apparatus having a processing circuit which is capable of measuring characteristics of the element while supplying a sense current in a lamination direction of the tunnel multilayered film for applying a given voltage, wherein the processing circuit measures, using an initial current value $I_0$ which is set not to destroy the element to be measured, a first resistance value R1 as an approximate resistance value of the element, and defines, based on the first resistance value R1 and a voltage value Vs which is a measurement standard for the element, a first modified current value $I_1$ ($I_1$=Vs/R1);

measures, using the first modified current value $I_1$, a second resistance value R2 as an approximate resistance value of the element, and defines, based on the second resistance value R2 and the voltage value Vs which is the measurement standard for the element, a second modified current value $I_2$ ($I_2$=Vs/R2);

measures, using the second modified current value $I_2$, a third resistance value R3 as an approximate resistance value of the element, and defines, based on the second resistance value R3 and the voltage value Vs which is the measurement standard for the element, an inspection current value Is (Is=Vs/R3); and measures the characteristics of the element using the sense current value Is.

According to another aspect of the present invention, there is provided an apparatus for measuring characteristics of a tunnel magnetoresistance effect element having a tunnel multilayered film comprising a tunnel barrier layer and a first and a second ferromagnetic layer formed to sandwich the tunnel barrier layer therebetween, the apparatus having a processing circuit which is capable of measuring characteristics of the element while supplying a sense current in a lamination direction of the tunnel multilayered film for applying a given voltage, wherein the processing circuit (1) measures, using an initial current value $I_0$ which is set not to destroy the element to be measured, a first resistance value R1 as an approximate resistance value of the element, and defines, based on the first resistance value R1 and a voltage value Vs which is a measurement standard for the element, a first modified current value $I_1$ ($I_1$=Vs/R1);

(2) measures, using the first modified current value $I_1$, a second resistance value R2 as an approximate resistance value of the element, and defines, based on the second resistance value R2 and the voltage value Vs which is the measurement standard for the element, a second modified current value $I_2$ ($I_2$=Vs/R2);

(3) measures, using the second modified current value $I_2$, a third resistance value R3 as an approximate resistance value of the element, and defines, based on the second resistance value R3 and the voltage value Vs which is the measurement standard for the element, a third modified current value $I_3$ ($I_3$=Vs/R3); and (4) repeats a step which is substantially identical to the step (4) so as to measure, using a $n^{th}$ modified current value $I_n$ (wherein n is an integer greater than or equal to 4), a $(n+1)^{th}$ resistance value Rn+1 as an approximate resistance value of the element, and define, based on the $(n+1)^{th}$ resistance value Rn+1 and the voltage value Vs which is the measurement standard for the element, an inspection current value Is (Is=Vs/Rn+1); and (5) measures the characteristics of the element using the inspection current value Is.

It is preferable that the initial current value $I_0$ is set to be in the range of 1 $\mu$A to 2.3 mA.

According to another aspect of the present invention, there is provided a hard disk drive having, at a tip of a suspension, a tunnel magnetoresistance effect element for deriving a magnetic signal from a magnetic recording hard disk, the tunnel magnetoresistance effect element having a tunnel multilayered film comprising a tunnel barrier layer and a first and a second ferromagnetic layer formed to sandwich the tunnel barrier layer therebetween, the hard disk drive having a processing circuit which is capable of deriving a magnetic signal while supplying a sense current in a lamination direction of the tunnel multilayered film for applying a given voltage, wherein the processing circuit measures, using an initial current value $I_0$ which is set not to destroy the element to be measured, a first resistance value R1 as an approximate resistance value of the element, and defines, based on the first resistance value R1 and a voltage value Vs which is a measurement standard for the element, a sense current value Ise (Ise=Vs/R1); and derives a magnetic signal using the sense current value Ise.

According to another aspect of the present invention, there is provided a hard disk drive having, at a tip of a suspension, a tunnel magnetoresistance effect element for deriving a magnetic signal from a magnetic recording hard disk, the tunnel magnetoresistance effect element having a tunnel multilayered film comprising a tunnel barrier layer and a first and a second ferromagnetic layer formed to sandwich the tunnel barrier layer therebetween, the hard disk drive having a processing circuit which is capable of deriving a magnetic signal while supplying a sense current in a lamination direction of the tunnel multilayered film for applying a given voltage, wherein the processing circuit measures, using an initial current value $I_0$ which is set not to destroy the element to be measured, a first resistance value R1 as an approximate resistance value of the element, and defines, based on the first resistance value R1 and a voltage value Vs which is a measurement standard for the element, a first modified current value $I_1$ ($I_1$=Vs/R1);

measures, using the first modified current value $I_1$, a second resistance value R2, and defines, based on the second resistance value R2 and the voltage value Vs which is the measurement standard for the element, a sense current Ise (Ise=Vs/R2); and derives a magnetic signal using the sense current value Ise.

According to another aspect of the present invention, there is provided a hard disk drive having, at a tip of a suspension, a tunnel magnetoresistance effect element for deriving a magnetic signal from a magnetic recording hard disk, the tunnel magnetoresistance effect element having a tunnel multilayered film comprising a tunnel barrier layer and a first and a second ferromagnetic layer formed to sandwich the tunnel barrier layer therebetween, the hard disk drive having a processing circuit which is capable of deriving a magnetic signal while supplying a sense current in a lamination direction of the tunnel multilayered film for applying a given voltage, wherein the processing circuit
  measures, using an initial current value $I_0$ which is set not to destroy the element to be measured, a first resistance value R1 as an approximate resistance value of the element, and defines, based on the first resistance value R1 and a voltage value Vs which is a measurement standard for the element, a first modified current value $I_1$ ($I_1$=Vs/R1);
  measures, using the first modified current value $I_1$, a second resistance value R2 as an approximate resistance value of the element, and defines, based on the second resistance value R2 and the voltage value Vs which is the measurement standard for the element, a second modified current $I_2$ ($I_2$=Vs/R2);
  measures, using the second modified current $I_2$, a third resistance value R3 as an approximate resistance value of the element, and defines, based on the third resistance value R3 and the voltage value Vs which is the measurement standard for the element, a sense current value Ise (Ise=Vs/R3); and
  derives a magnetic signal using the sense current value Ise.

According to another aspect of the present invention, there is provided a hard disk drive having, at a tip of a suspension, a tunnel magnetoresistance effect element for deriving a magnetic signal from a magnetic recording hard disk, the tunnel magnetoresistance effect element having a tunnel multilayered film comprising a tunnel barrier layer and a first and a second ferromagnetic layer formed to sandwich the tunnel barrier layer therebetween, the hard disk drive having a processing circuit which is capable of deriving a magnetic signal while supplying a sense current in a lamination direction of the tunnel multilayered film for applying a given voltage, wherein the processing circuit
  (1) measures, using an initial current value $I_0$ which is set not to destroy the element to be measured, a first resistance value R1 as an approximate resistance value of the element, and defines, based on the first resistance value R1 and a voltage value Vs which is a measurement standard for the element, a first modified current value $I_1$ ($I_1$=Vs/R1);
  (2) measures, using the first modified current value $I_1$, a second resistance value R2 as an approximate resistance value of the element, and defines, based on the second resistance value R2 and the voltage value Vs which is the measurement standard for the element, a second modified current $I_2$ ($I_2$=Vs/R2);
  (3) measures, using the second modified current $I_2$, a third resistance value R3 as an approximate resistance value of the element, and defines, based on the third resistance value R3 and the voltage value Vs which is the measurement standard for the element, a third modified current value $I_3$ ($I_3$=Vs/R3); and
  (4) repeats a step which is substantially identical to the step (4) so as to measure, using a $n^{th}$ modified current value $I_n$ ((wherein n is an integer greater than or equal to 4), a $(n+1)^{th}$ resistance value Rn+1 as an approximate resistance value of the element, and defines, based on the $(n+1)^{th}$ resistance value Rn+1 and the voltage value Vs which is the measurement standard for the element, a sense current value Ise (Ise=Vs/Rn+1); and
  (5) derives a magnetic signal using the sense current value Ise.

It is preferable that the initial current value $I_0$ is set to be in the range of 1 $\mu$A to 2.3 mA.

Considering thermal noise and electrostatic destruction, TMR elements having a resistance value of 1 to 300 Ω are expected to be used. Therefore, as a basic operation for measuring characteristics of the TMR element, a voltage value which can prevent destruction of the TMR element is derived, an initial current value is derived based on the voltage value, the initial current value is supplied for measuring a resistance value, and characteristics (e.g. electromagnetic transduction characteristic, etc.) are measured using a current value which is derived based on the measured resistance value for achieving a desired voltage value.

BRIEF DESCRIPTION OF THE DRAWINGS

FIG. 4 is a flow diagram for explaining a preferred embodiment of a method for measuring characteristics of a tunnel magnetoresistance effect element according to the present invention;

DETAILED DESCRIPTION OF THE INVENTION

Figure 1:
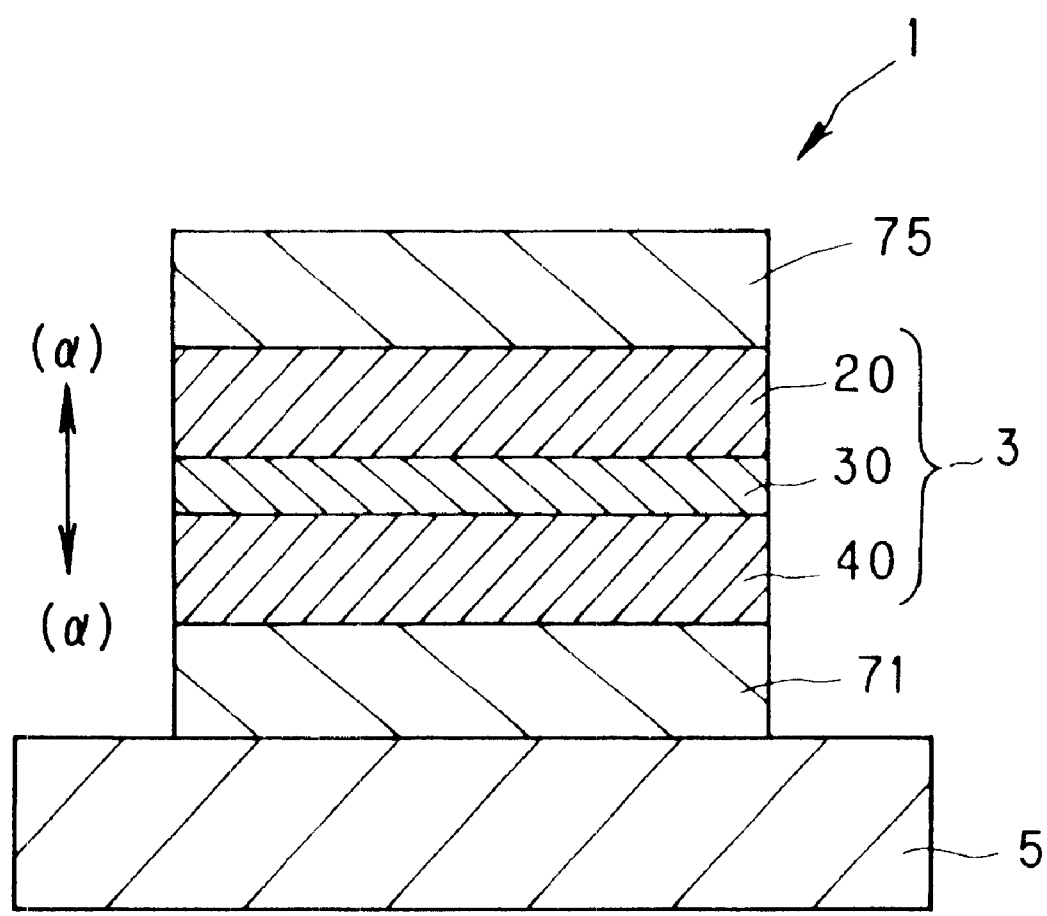
FIG. 1 is a sectional view of a ferromagnetic tunnel magnetoresistance effect element according to a preferred embodiment of the present invention.

Hereinbelow, the present invention will be described in terms of preferred embodiments with reference to the accompanying drawings.

First, before explaining a method for measuring characteristics of an element according to the present invention, a tunnel magnetoresistance element 1 (hereinafter simply referred to as "TMR element") to be measured is explained.

In this embodiment, the TMR element 1 is provided with a tunnel multilayered film 3 exhibiting a spin tunnel magnetoresistance effect. Specifically, the tunnel multilayered film 3 has a multilayered structure composed of, in a laminate fashion, a tunnel barrier layer 30 and first and second ferromagnetic layers 20 and 40 sandwiching the tunnel barrier layer 30 therebetween.

A pair of electrodes 75 and 71 are further stacked on the first and second ferromagnetic layers 20 and 40 on their sides remote from the tunnel barrier layer 30 for causing a current to flow in a thickness direction ($\alpha$ direction) of the tunnel multilayered film 3. Specifically, in the example shown in FIG. 1, the electrode 71, the second ferromagnetic layer 40, the tunnel barrier layer 30, the first ferromagnetic layer 20 and the electrode 75 are formed in turn on a substrate 5.

Of the two ferromagnetic layers 20 and 40, it is general that, for example, the first ferromagnetic layer 20 is set to function as a free layer which can freely change a direction of magnetization in response to an external magnetic field as magnetic information, while the second ferromagnetic layer 40 is set to function as a magnetization fixed layer whose magnetization direction is fixed in one direction. In such an arrangement, a pinning layer is formed for fixing the magnetization of the ferromagnetic layer 40. Naturally, the positions and functions of the ferromagnetic layers 20 and 40 may be reversed.

The ferromagnetic layers 20 and 40 are made preferably of a high spin polarization material for the purpose of obtaining a high TMR ratio, such as Fe, Co, Ni, FeCo, NiFe, CoZrNb, FeCoNi. The thickness of the ferromagnetic layer 20 is 20 to 200 Å, preferably 40 to 100 Å. An excessive thickness of the ferromagnetic layer 20 tends to result in lowering of an output at the time of head operation and, in contrast, if it is thinner than required, magnetic properties become unstable to result in increase of noise at the time of head operation. For example, the thickness of the ferromagnetic layer 40, which act as so called magnetized fixed layer (ferromagnetic pined layer), is 10 to 50 Å, preferably 20 to 30 Å. If the thickness is more than required, the pinning of magnetization by a later-described antiferromagnetic body is weakened and, on the other hand, if it is less than required, the TMR ratio tends to reduce.

Each of the first and second ferromagnetic layers 20 and 40 is not limited to a single layer, and a laminate body in combination of a pair of magnetic layers in antiferromagnetic type magnetic coupling and a non-magnetic metal layer sandwiched therebetween is one of particularly preferable examples. As such a laminate body, a ferromagnetic layer in the form of a three-layered laminate body of CoFe (30 Å in thickness)/Ru (7 Å in thickness)/CoFe (20 Å in thickness) can be cited, for example.

The tunnel barrier layer 30 which is sandwiched between two ferromagnetic layers 20, 40 is made of $Al_2O_3$, NiO, GdO, MgO, $Ta_2O_5$, $MoO_2$, $TiO_2$, $WO_2$ or the like. The thickness of the tunnel barrier layer 30 is desired to be as thin as possible for reducing the resistance of the element. However, if the thickness becomes thin enough to cause pin holes, a leak current is generated, which is not preferable. In general, the thickness is set to about 5 to 20 Å.

The pinning layer is not shown in FIG. 1. However, for pinning the magnetization of the second ferromagnetic layer 40 in FIG. 1, a pinning layer in the form of an antiferromagnetic layer is normally formed between the electrode 71 and the second ferromagnetic layer 40. If the functions of the ferromagnetic layers 20 and 40 are reversed, a pinning layer in the form of an antiferromagnetic layer is formed between the electrode 75 and the first ferromagnetic layer 20.

The pinning layer for pinning the magnetization of the ferromagnetic pinned layer 40 is normally made of an antiferromagnetic material, although not limited thereto as long as exhibiting a pinning function. The thickness of the pinning layer is normally set in the range of 60 to 300 Å.

Figure 2:
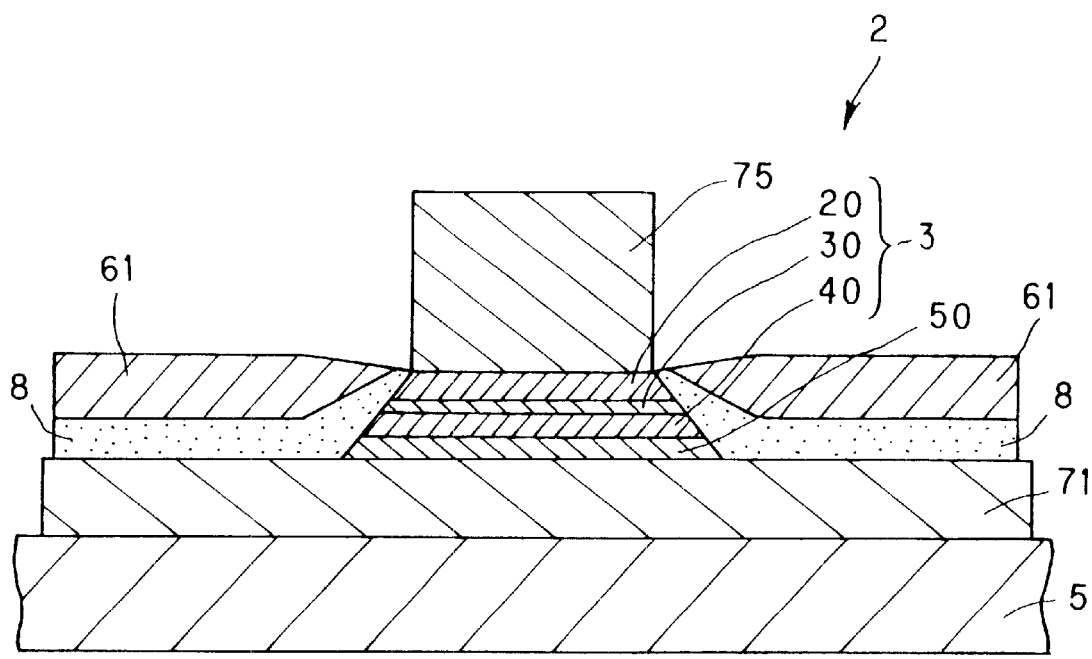
FIG. 2 is a sectional view showing a preferred embodiment, wherein the ferromagnetic tunnel magnetoresistance effect element according to the present invention is applied to a tunnel magnetic head.

FIG. 2 shows an embodiment in which the tunnel magnetoresistance effect element according to the present invention is applied to a tunnel magnetic head. It is noted that the tunnel magnetic head is included in the concept of the tunnel magnetoresistance effect element according to the present invention, and thus characteristics of the tunnel magnetic head can be measured according to the present invention. In other words, the tunnel magnetic head can be an object to be measured even in the form of a magnetic head as shown in FIG. 2.

The tunnel magnetic head 2 shown in FIG. 2 as a preferred example comprises the electrode 71, the pinning layer 50, the second ferromagnetic layer 40, the tunnel barrier layer 30, the first ferromagnetic layer 20, and the electrode 75 which are stacked on the substrate 5 in the order named. Further, hard magnet layers 61 and 61, being separated by insulating layers 8, 8 for maintaining insulation between the electrodes 71 and 75, are provided for applying a bias magnetic field to the first ferromagnetic layer 20. In this embodiment, the pinning layer 50 is positioned at the bottom portion, while, of course, the pinning layer 50 can be positioned at the top portion. In this case, the tunnel magnetic head comprises the electrode 71, the first ferromagnetic layer 20, the tunnel barrier layer 30, the second ferromagnetic layer 40, the pinning layer 50 and the electrode 75 which are stacked on the substrate 5 in the order named.

Figure 3A:
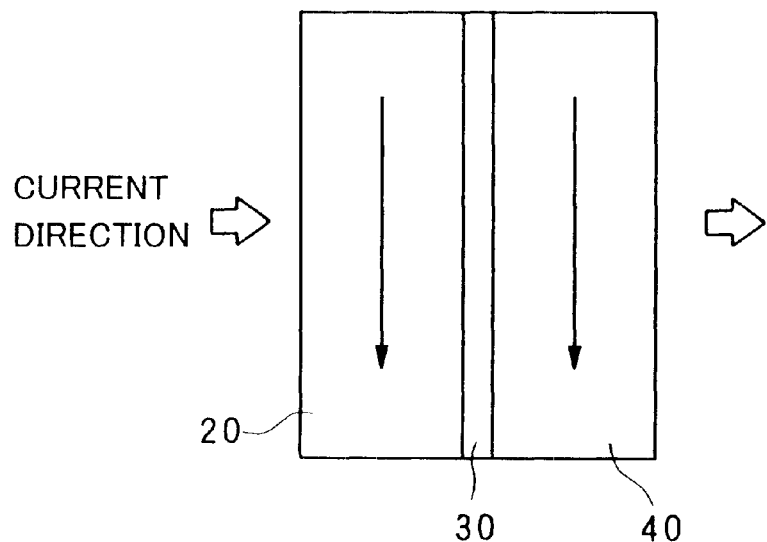
FIGS. 3A and 3B are diagrams for explaining a ferromagnetic tunnel magnetoresistance effect.
Figure 3B:
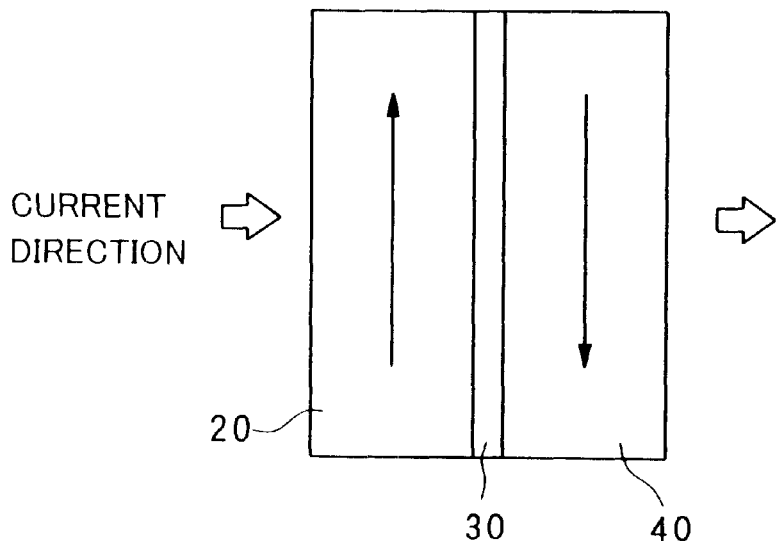

Now, the ferromagnetic tunnel magnetoresistance effect will be briefly explained with reference to FIGS. 3A and 3B. The ferromagnetic tunnel magnetoresistance effect is a phenomenon that when a current is applied in the laminate direction between the ferromagnetic layers 20 and 40 sandwiching the tunnel barrier layer 30, a tunnel current flowing in the tunnel barrier layer 30 changes depending on a relative angle of magnetization between the ferromagnetic layers 20 and 40. The tunnel barrier layer 30 is a thin insulation film which allows electrons to pass therethrough while keeping spin due to the ferromagnetic tunnel magnetoresistance effect. As illustrated in FIG. 3A, when the ferromagnetic layers 20 and 40 are parallel in magnetization to each other (or a relative magnetization angle therebetween is small), the tunnel probability of electrons is increased and, therefore, the resistance of the current flowing between the ferromagnetic layers 20 and 40 is decreased. In contrast with this, as illustrated in FIG. 3B, when the ferromagnetic layers 20 and 40 are antiparallel in magnetization to each other (or a relative magnetization angle therebetween is large), the tunnel probability of electrons is lowered, therefore, the resistance of the current flowing therebetween is increased. By utilizing the change in resistance depending on the change in relative magnetization angle, an external magnetic field is detected, for example.

As to the TMR element (including the head structure type), in order to assure the quality of the products, various characteristic measurements are executed, including measuring a resistance value of the element in a wafer form, measuring a $\rho$-H (resistance value–external magnetic field) characteristic in a wafer form, measuring a $\rho$-H (resistance value–external magnetic field) characteristic in a bar form, and measuring an electromagnetic transduction characteristic in a HGA (head gimbal assembly) condition.

The method for measuring characteristics of a TMR element of the present invention will be described in detail hereinbelow.

FIG. 4 shows a flow diagram for explaining a first preferred embodiment of a method for measuring characteristics of a TMR element according to the present invention.

As shown in FIG. 4, in the present embodiment, an initial current value $I_0$ which does not destroy a TMR element to be measured is first set (step I-1). It is preferable to set this initial current value $I_0$ to be less than or equal to 2.3 mA, particularly, 1 $\mu$A to 2.3 mA.

Such an initial current value $I_0$ can be experimentally determined by the steps of
- applying a first applying voltage 100 mV to the element to be measured, and gradually increasing the voltage value by 50 mV or 100 mV,
- measuring the TMR rate (%) and the resistance value ($\Omega$) of the element after applying each applying voltage,
- determining that the degradation of the element begins when the resistance value of the element is decreased by about 1 (%), and
- determining that the element is destroyed when the TMR rate (%) and the resistance value ($\Omega$) of the element are drastically decreased.

The inventors of the present invention tested elements having different resistance values, and found that the characteristics of the elements did not change until the first applying voltage reached about 700 mV, however, the characteristics change began when the first applying voltage became more than 700 mV, and, beyond approximately 1100 mV, the elements destroyed. It will become more apparent from examples described later.

In view of thermal noise and electrostatic destruction, TMR elements having a resistance value in the range of 1 to 300 $\Omega$ are considered to be preferable for use. Therefore, it is sufficient to cover the above resistance range for TMR characteristic measurement. Therefore, considering the resistance value 300 $\Omega$ and the applying voltage 700 mV, the initial current value $I_0$, which is first applied to the element, is desirably less than or equal to 2.3 mA (e.g. 2.3 mA), as described above (step I-1). The lower limit of the initial current value $I_0$ is determined by the resolution in the highest quality tester available at present. When the initial current value $I_0$ becomes less than 1 $\mu$A, reliability of measured resistance values decreases, which is not desirable.

Then, a first resistance value R1 is measured as an approximate resistance value of the element using the current resistance value $I_0$, and an inspection current value Is (Is=Vs/R1) is defined based on the first resistance value R1 and a voltage value Vs which is a measurement standard for the element (step I-2). The reason for using the constant voltage value Vs as the measurement standard is that in order to obtain TMR element products having homogeneous characteristics, it is preferable to independently apply sense currents to the respective elements so that the constant voltage is applied to all the elements.

Then, using the inspection current value Is, characteristics of the element, e.g. an electromagnetic transduction characteristic, etc. are measured (step I-3).

Figure 5:
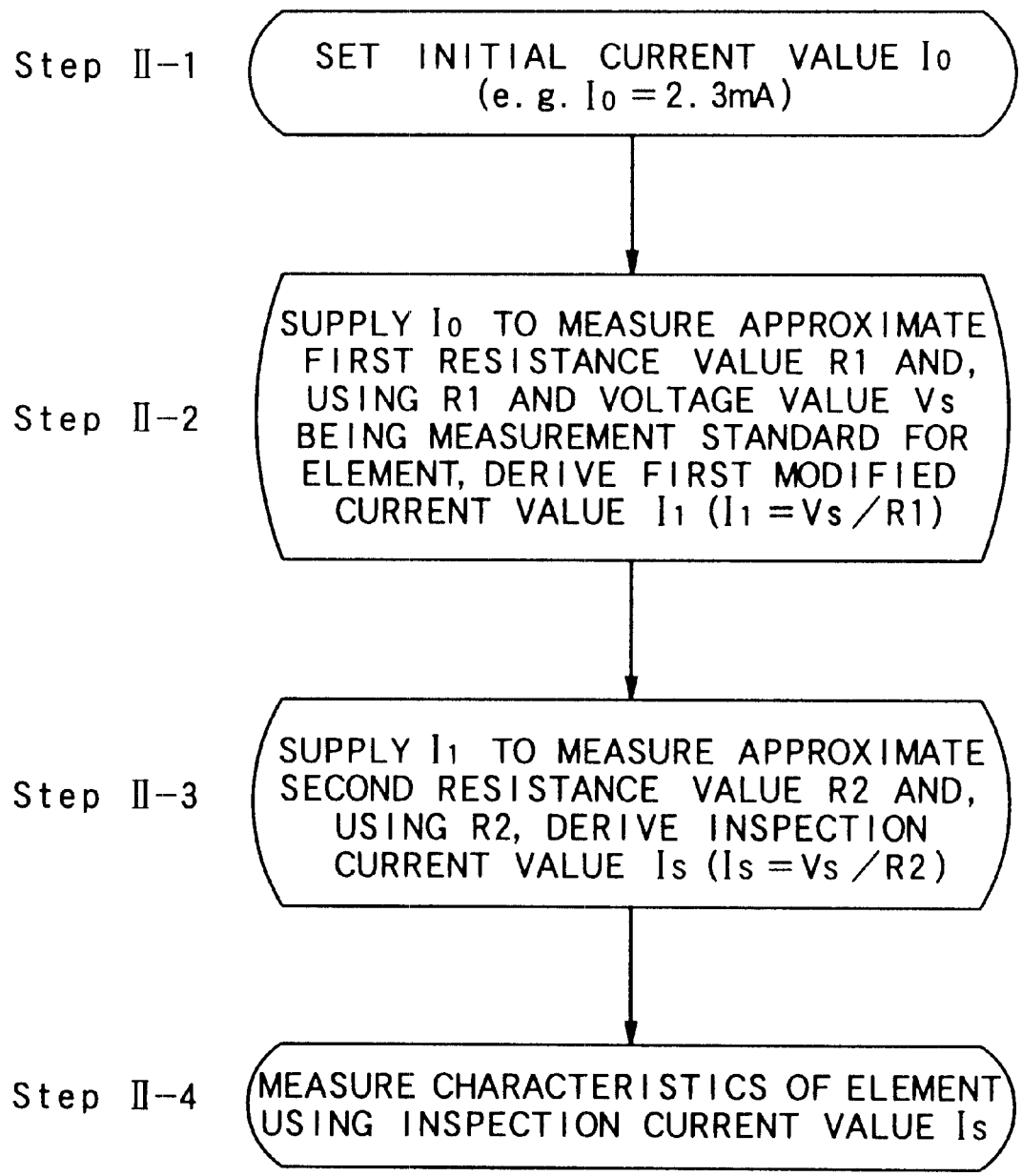
FIG. 5 is a flow diagram for explaining a preferred embodiment of a method for measuring characteristics of a tunnel magnetoresistance effect element according to the present invention.

FIG. 5 shows a flow diagram for explaining a second preferred embodiment of a method for measuring characteristics of a TMR element according to the present invention.

As shown in FIG. 5, in the present embodiment, an initial current value $I_0$ which does not destroy a TMR element to be measured is first set as in the foregoing first embodiment. As described above, it is preferable to set this initial current value $I_0$ to be less than or equal to 2.3 mA, e.g. 2.3 mA (step II-1).

Then, a first resistance value R1 is measured as an approximate resistance value of the element using the current value $I_0$, and a first modified current value $I_1$ ($I_1$=Vs/R1) is defined based on the first resistance value R1 and a voltage value Vs which is a measurement standard for the element (step II-2). As described above, the reason for using the constant voltage value Vs as the measurement standard is that in order to obtain TMR element products having homogeneous characteristics, it is preferable to independently apply sense currents to the respective elements so that the constant voltage is applied to all the elements.

Then, a second resistance value R2 is measured as an approximate resistance value of the element using the first modified value $I_1$, and an inspection current value Is (Is=Vs/R2) is defined based on the second resistance value R2 and the voltage value Vs which is the measurement standard for the element (step II-3). Then, using the inspection current value Is, characteristics of the element, e.g. and electromagnetic transduction characteristic, etc. are measured (step II-4). Also in this case, the basic idea is that the constant voltage value Vs is used as the measurement standard and the sense currents are independently applied to the respective elements so that the constant voltage is ensured for all the elements. Due to the steps described above (so-called feed back function), the second embodiment can obtain the voltage value Vs which is closer to a target value than the first embodiment.

Figure 6:
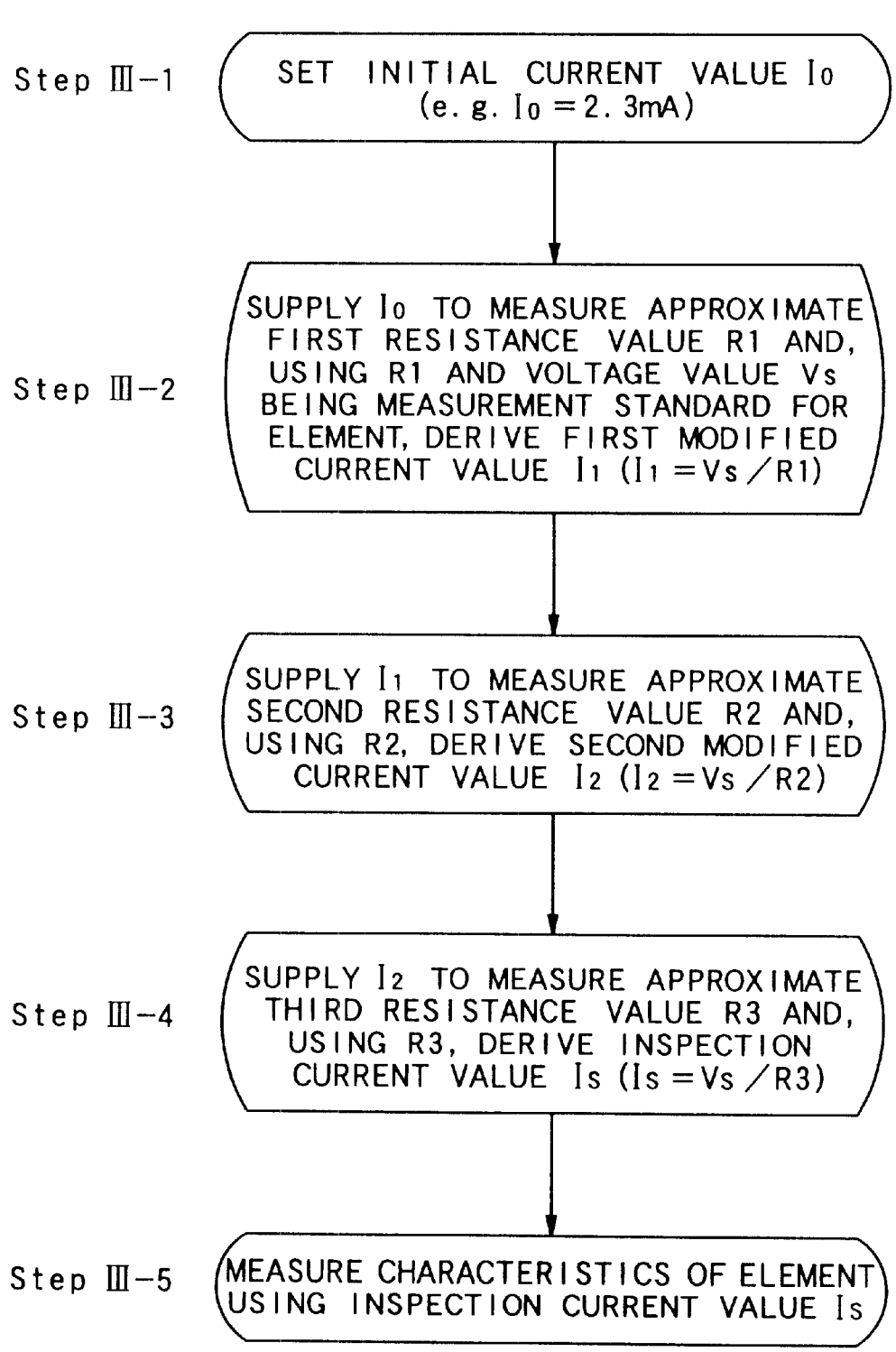
FIG. 6 is a flow diagram for explaining a preferred embodiment of a method for measuring characteristics of a tunnel magnetoresistance effect element according to the present invention.

FIG. 6 shows a flow diagram for explaining a third preferred embodiment of a method for measuring characteristics of a TMR element according to the present invention.

As shown in FIG. 6, in the present embodiment, an initial current value $I_0$ which does not destroy a TMR element to be measured is first set as in the foregoing first embodiment. As described above, it is preferable to set this initial current value $I_0$ to be less than or equal to 2.3 mA, e.g. 2.3 mA (step III-1).

Then, a first resistance value R1 is measured as an approximate resistance value of the element using the current value $I_0$, and a first modified current value $I_1$ ($I_1$=Vs/R1) is defined based on the first resistance value R1 and a voltage value Vs which is a measurement standard for the element (step III-2). As described above, the reason for using the constant voltage value Vs as the measurement standard is that in order to obtain TMR element products having homogeneous characteristics, it is preferable to independently apply sense currents to the respective elements so that the constant voltage is applied to all the elements.

Then, a second resistance value R2 is measured as an approximate resistance value of the element using the first modified current value $I_1$, and a second modified current value $I_2$ ($I_2$=Vs/R2) is defined based on the second resistance value R2 and the voltage value Vs which is the measurement standard for the element (step III-3).

Then, a third resistance value R3 is measured as an approximate resistance value of the element using the second modified value $I_2$, and an inspection current value Is (Is=Vs/R3) is defined based on the third resistance value R3 and the voltage value Vs which is the measurement standard for the element(step III-4).

Thereafter, using the inspection current value Is, characteristics of the element, e.g. an electromagnetic transduction characteristic, etc. are measured (step III-5). Also in this case, the basic idea is that the constant voltage value Vs is used as the measurement standard and the sense currents are independently applied to the respective elements so that the constant voltage is ensured for all the elements. The third embodiment can obtain the voltage value Vs which is closer to a target value than the first and second embodiments.

Figure 7:
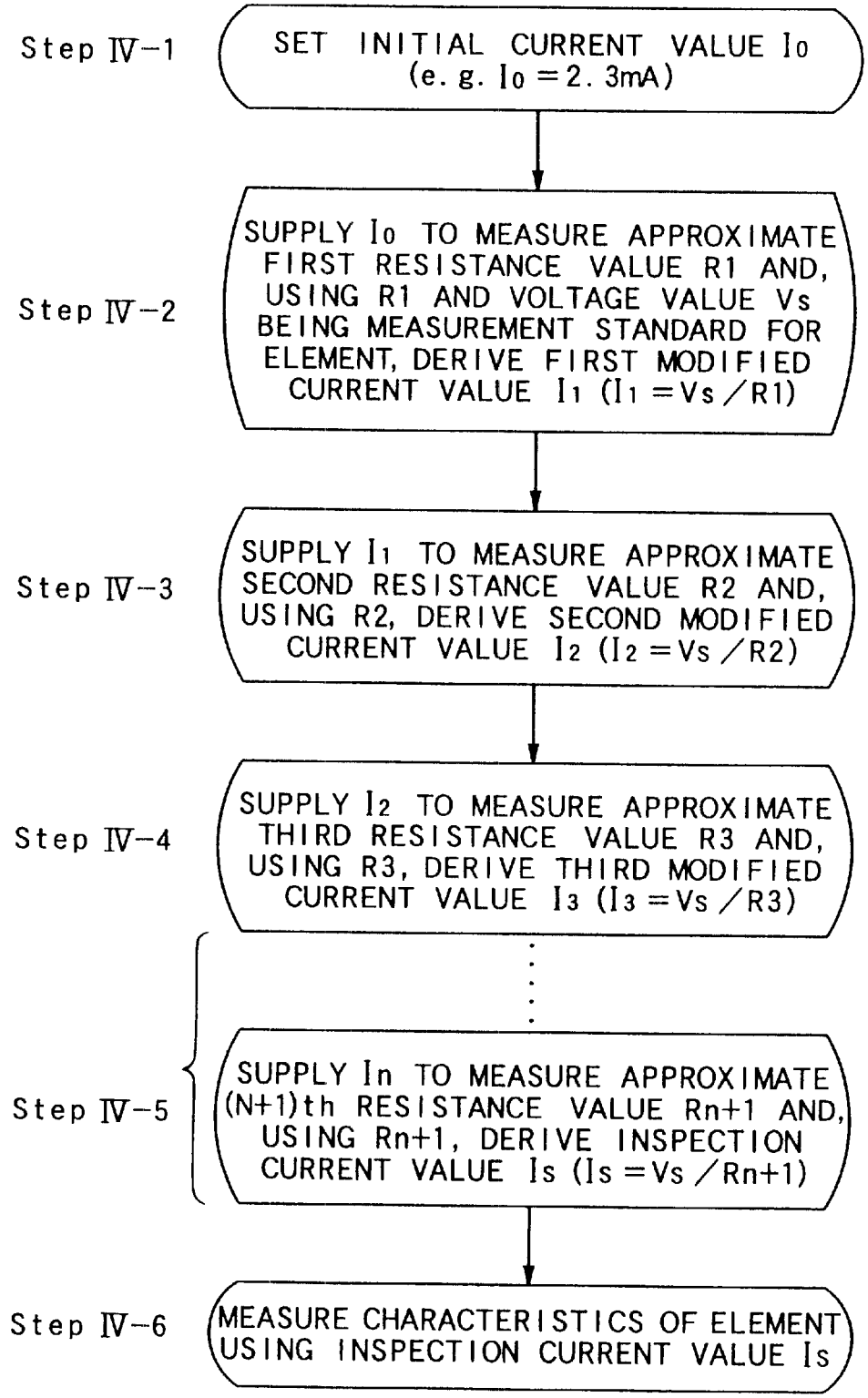
FIG. 7 is a flow diagram for explaining a preferred embodiment of a method for measuring characteristics of a tunnel magnetoresistance effect element according to the present invention.

FIG. 7 shows a flow diagram for explaining a fourth preferred embodiment of a method for measuring characteristics of a TMR element according to the present invention.

As shown in FIG. 7, in the present embodiment, (1) an initial current value $I_0$ which does not destroy a TMR element to be measured is first set as in the foregoing first embodiment. As described above, it is preferable to set this initial current value $I_0$ to be less than or equal to 2.3 mA, e.g. 2.3 mA (step IV-1).

Then, (2) a first resistance value R1 is measured as an approximate resistance value of the element using the initial current value $I_0$, and a first modified current value $I_1$ ($I_1$=Vs/R1) is defined based on the first resistance value R1 and a voltage value Vs which is a measurement standard for the element (step IV-2). As described above, the reason for using the constant voltage value Vs as the measurement standard is that in order to obtain TMR element products having homogeneous characteristics, it is preferable to independently apply sense currents to the respective elements so that the constant voltage is applied to all the elements.

Then, (3) a second resistance value R2 is measured as an approximate resistance value of the element using: the first modified current value $I_1$, and a second modified current value $I_2$ ($I_2$=Vs/R2) is defined based on the second resistance value R2 and the voltage value Vs which is the measurement standard for the element (step IV-3).

Then, (4) a third resistance value R3 is measured as an approximate resistance value of the element using the second modified value $I_2$, and a third modified current value $I_3$ ($I_3$=Vs/R3) is defined based on the third resistance value R3 and the voltage value Vs which is the measurement standard for the element (step IV-4).

In the foregoing third embodiment, the third modified current value $I_3$ is used as the sense current Is. However, in this fourth embodiment, the number of times of feed back is increased so that the voltage value becomes closer to a target value, thereby the modified current value is obtained more than or equal to 4 times.

Specifically, (5) a step which is substantially identical to the foregoing step (4) is repeated so as to measure a $(n+1)^{th}$ resistance value Rn+1 as an approximate resistance value of the element using a $n^{th}$ modified current value $I_n$ (wherein n is an integer greater than or equal to 4], and define an inspection current value Is (Is=Vs/Rn+1) based on the $(n+1)^{th}$ resistance value Rn+1 and the voltage value Vs which is the measurement standard for the element (this step can include more than one step, but, for the sake of simplicity, is represented as a step IV-5).

Thereafter, (6) characteristics of the characteristics of the element, e.g. an electromagnetic transduction characteristic, etc. are measured using the inspection current value Is (step IV-6).

Also in this case, the basic idea is that the constant voltage value Vs is used as the measurement standard and the sense currents are independently applied to the respective elements so that the constant voltage is ensured for all the elements. The fourth embodiment can obtain the voltage value Vs which is closer to a target value than the first, second and third embodiments.

The foregoing characteristic measuring method is generally realized by a program in a processing circuit of a characteristic measuring apparatus such as a tester. In this way, simple operation and accurate inspection can be achieved.

Figure 8:
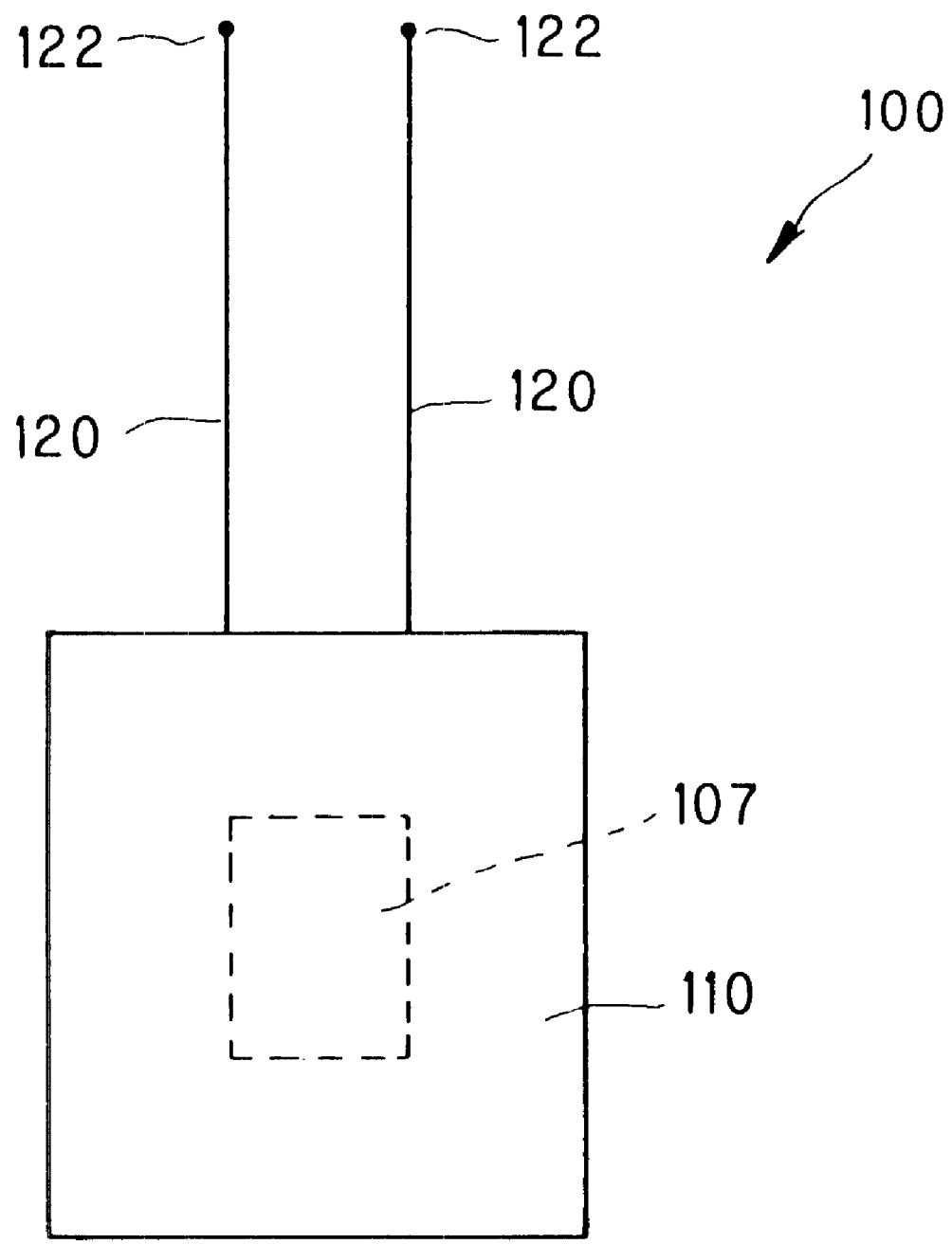
FIG. 8 is a schematic diagram for explaining an apparatus for measuring characteristics of a tunnel magnetoresistance effect element.

A specific example of the characteristic measuring apparatus 100 is shown in FIG. 8. Referring to FIG. 8, the apparatus 100 for measuring characteristics of a TMR element comprises a body portion 110 and element connecting lines 120, 120 (each having a terminal portion 122). The body portion 110 includes a processing circuit 107 which is capable of measuring characteristics while supplying a sense current in a lamination direction of a tunnel multilayered film for applying a given voltage. In the processing circuit 107, a program is loaded that can substantially realize the characteristic measuring method described in the foregoing first, second, third or fourth embodiment. When using the apparatus 100, for example, an operator inputs an experimentally predetermined proper initial current value $I_0$ into the apparatus 100.

Figure 12A:
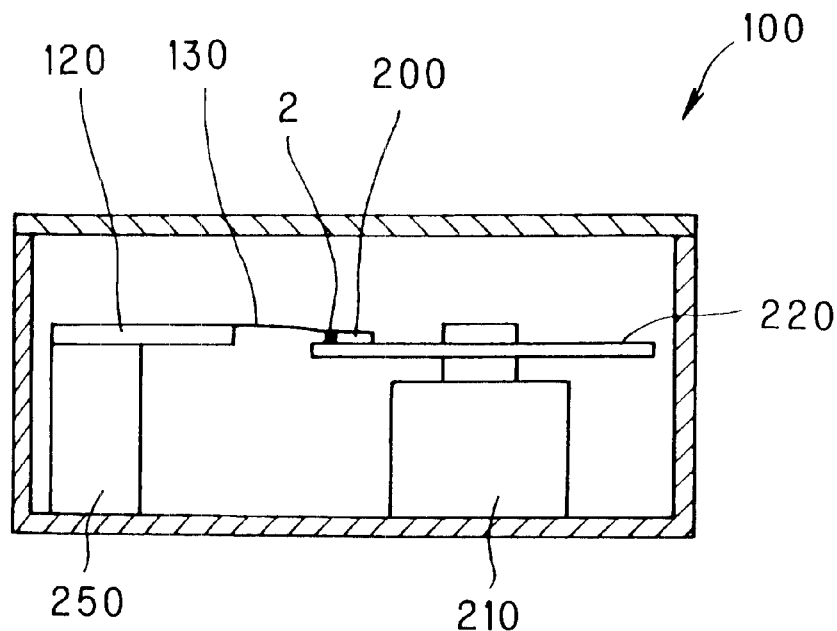
FIG. 12A is a schematic front view for explaining an internal structure of a hard disk drive.
Figure 12B:
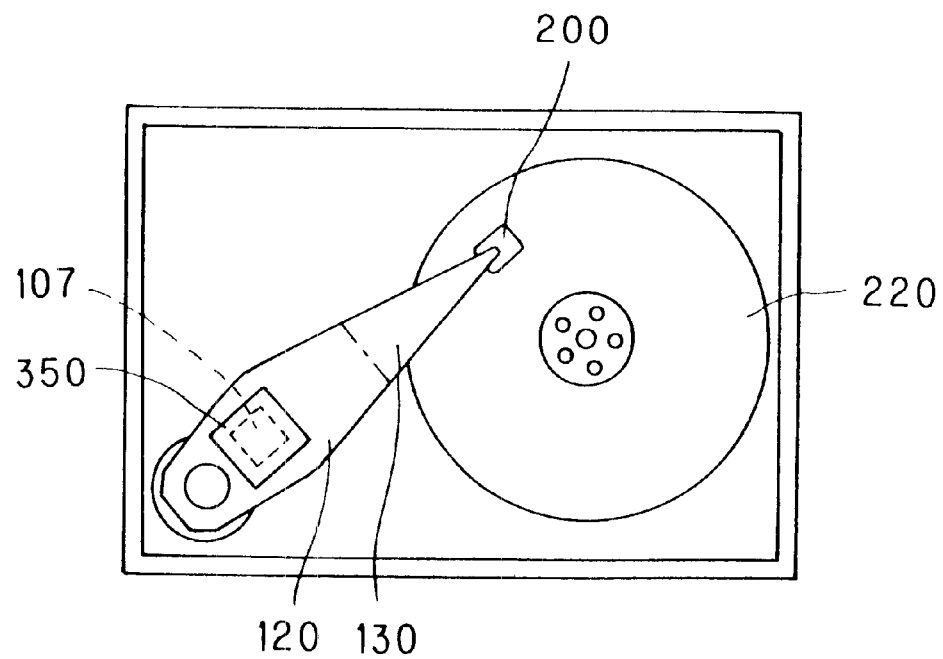
FIG. 12B is a schematic plan view thereof.

In another preferred embodiment, a processing circuit which can execute an operation substantially identical to that of the processing circuit 107 is installed in a hard disk drive. A preferred example of the hard disk drive 100 is shown in FIGS. 12A and 12B. FIG. 12A is a schematic front view for explaining an internal structure of the hard disk drive 100, and FIG. 12B is a plan view thereof. The hard disk drive 100 comprises an actuator 250, a hard arm 120 connected to the actuator 250, a suspension 130 coupled to the hard arm 120, and a slider 200 and a TMR head 2 connected to the tip of the suspension 130. The TMR head 2 is capable of deriving a magnetic signal from a. magnetic recording disk 220 which is connected to a disk driving motor 210 for rotation, and a sense current for deriving the signal can flow into the TMR head 2. In the embodiment shown in FIGS. 12A and 12B, an integrated circuit 350 is provided on the hard arm 120, and the processing circuit 107 is installed in the integrated circuit 350 which defines a sense current value Ise for applying a desired voltage to a TMR element. It is noted that the integrated circuit 350 is not necessarily provided on the hard arm 120, rather, it can be provided at any portion in the hard disk drive 100. The operation of the processing circuit 107 is substantially identical to that described above, however, for ensuring accuracy, an operation of the processing circuit 107 used in the hard disk drive is described hereinbelow.

In the first manner, the processing circuit 107 is capable of measuring, using an initial current value $I_0$ which is set not to destroy an element to be measured, a first resistance value R1 as an approximate resistance value of the element, defining, based on the first resistance value R1 and a voltage value Vs which is a measurement standard for the element, a sense current value Ise (Ise=Vs/R1), and deriving a magnetic signal from the sense current value Ise.

In the second manner, the processing circuit 107 is capable of measuring, using an initial current value $I_0$ which is set not to destroy an element to be measured, a first resistance value R1 as an approximate resistance value of the element, defining, based on the first resistance value R1 and a voltage value Vs which is a measurement standard for the element, a first modified current value $I_1$ ($I_1$=Vs/R1), measuring, using the first modified current value $I_1$, a a second resistance value R2, defining, based on the second resistance value R2 and the voltage value Vs which is the measurement standard for the element, a sense current Ise (Ise=Vs/R2), and deriving a magnetic signal using the sense current value Ise.

In the third manner, the computing unit 107 is capable of measuring, using an initial current value $I_0$ which is set not to destroy a element to be measured, a first resistance value R1 as an approximate resistance value of the element, defining, based on the first resistance value R1 and a voltage value Vs which is a measurement standard for the element, a first modified current value $I_1$ ($I_1$=Vs/R1), measuring, using the first modified current value $I_1$, a second resistance value R2 as an approximate resistance value of the element, defining, based on the second resistance value R2 and the voltage value Vs which is the measurement standard for the element, a second modified current $I_2$ ($I_2$=Vs/R2), measuring, using the second modified current $I_2$, a third resistance value R3 which is equal to the approximate resistance value of the element, defining, based on the third resistance value R3 and the voltage value Vs which is the measurement standard for the element, a sense current value Ise (Ise=Vs/R3), and deriving a magnetic signal using the sense current value Ise.

In the fourth manner, the processing circuit 107 is capable of (1) measuring, using an initial current value $I_0$ which is set not to destroy a element to be measured, a first resistance value R1 as an approximate resistance value of the element, and defining, based on the first resistance value R1 and a voltage value Vs which is a measurement standard for the element, a first modified current value $I_1$ ($I_1$=Vs/R1), (2) measuring, using the first modified current value $I_1$, a second resistance value R2 as an approximate resistance value of the element, and defining, based on the second resistance value R2 and the voltage value Vs which is the measurement standard for the element, a second modified current $I_2$ ($I_2$=Vs/R2), (3) measuring, using the second modified current $I_2$, a third resistance value R3 as an approximate resistance value of the element, and defining, based on the third resistance value R3 and the voltage value Vs which is the measurement standard for the element, a third modified current value $I_3$ ($I_3$=Vs/R3), and, (4) repeating a step which is substantially identical to the step (4) so as to measure, using a $n^{th}$ modified current value $I_n$ (wherein n is an integer greater than or equal to 4), a $(n+1)^{th}$ resistance value Rn+1 as an approximate resistance value of the element, and define, based on the $(n+1)^{th}$ resistance value Rn+1 and the voltage value Vs which is the measurement standard for the element, a sense current value Ise (Ise=Vs/Rn+1), and (5) deriving a magnetic signal using the sense current value Ise.

In any of the foregoing manners, the initial current value $I_0$ is set to be in the range of 1 $\mu$A to 2.3 mA as described above.

The invention of the foregoing method for measuring characteristics of the TMR element will be explained in further detail based on the following concrete experimental examples.

EXAMPLE 1

Ferromagnetic tunnel magnetoresistance effect element samples shown below were prepared. Specifically, each sample was prepared by stacking an electrode layer 71 (Ta; 50 Å in thickness), a ferromagnetic layer 20 (laminate body of NiFe layer (100 Å in thickness) and CoFe layer (20 Å in thickness)) serving as a free layer, a tunnel barrier layer 30 (aluminum oxide; 10 Å in thickness), a pinned ferromagnetic layer 40 (CoFe; 30 Å in thickness) whose magnetization direction is fixed in a detection magnetic field direction, a pinning layer 50 (RuRhMn; 100 Å in thickness) for pinning magnetization of the ferromagnetic layer 40, and an electrode layer 75 (Ta; 50 Å in thickness), in the order named on a substrate 5 (AlTiC with $Al_2O_3$). The size of each sample was 1 $\mu$m×1 $\mu$m. Two TMR elements having layers designed as above were prepared. Since these two element were prepared based on common design specification, the characteristics of these elements should have been identical to each other. However, in practice, the characteristics of these elements were different from each other due to a slight difference between the film thicknesses of the tunnel barrier layers 30 and due to a slight difference between physical characteristics of the films.

Using these two TMR element samples (hereinafter referred to as "element sample I-1" and "element sample I-2"), a tolerance test against the applying voltage was carried out in the following manner.

TOLERANCE TEST AGAINST APPLYING VOLTAGE

As shown in Tables 1 and 2 given below, a first applying voltage 100 mV was applied to the element samples I-1 and I-2, and the voltage was gradually increased by 50 mV or 100 mV. After applying each voltage, the resistance value ($\Omega$) and the TMR rate (%) were measured as follows. Specifically, it was determined that the degradation of the element began when the resistance value of the element was decreased by about 1 (%) and that the element was destroyed when the TMR rate (%) and the resistance value ($\Omega$) of the element were drastically decreased.

(1) Resistance Value R ($\Omega$)

A constant current was supplied so that a voltage applied to each 1 $\mu m^2$ size sample became about 50 mV in a zero magnetic field, then a resistance value Rmin was derived from a minimum voltage value upon applying a magnetic field of ±900 (Oe) and set as a resistance value R ($\Omega$).

(2) TMR Ratio (%)

A constant current was supplied so that a voltage applied to each sample became about 50 mV in a zero magnetic field, then minimum and maximum resistance values Rmin and Rmax were derived from a minimum and a maximum voltage value, respectively, upon applying a magnetic field of ±900 (Oe), and a TMR ratio (%) was derived from the following equation (1):

$$\text{TMR Ratio (\%)}=(\text{Rmax}-\text{Rmin})/\text{Rmin}\times 100 \quad (1)$$

TABLE 1

(data of element sample I-1)

| first applying voltage (mV) | TMR ratio (%) | R ($\Omega$) | R variation rate (%) |
|---|---|---|---|
| 100 | 10.31242 | 55.63639 | 0.0 |
| 200 | 10.30945 | 55.72142 | 0.2 |
| 300 | 10.22236 | 55.58392 | −0.1 |
| 400 | 10.34576 | 55.69924 | 0.1 |
| 500 | 10.54372 | 55.71253 | 0.1 |
| 600 | 10.31871 | 55.65739 | 0.0 |
| 650 | 10.26595 | 55.69720 | 0.1 |
| 700 | 10.32707 | 55.56341 | −0.1 |
| 750 | 10.30860 | 55.63639 | 0.0 |
| 800 | 10.34526 | 55.72142 | 0.2 |
| 850 | 10.52373 | 55.48392 | −0.3 |
| 900 | 10.27865 | 55.42582 | −0.4 |
| 950 | 10.39991 | 55.29086 | −0.6 |
| 1000 | 10.31833 | 54.99689 | −1.1 |
| 1050 | 10.33155 | 54.95971 | −1.2 |
| 1100 | 10.30077 | 55.02233 | −1.1 |

TABLE 1-continued (data of element sample I-1)

| first applying voltage (mV) | TMR ratio (%) | R (Ω) | R variation rate (%) |
|---|---|---|---|
| 1150 | 10.30525 | 54.96189 | −1.2 |
| 1200 | 10.34986 | 54.85475 | −1.4 |
| 1250 | 10.35934 | 54.53513 | −2.0 |
| 1300 | 10.46073 | 54.52815 | −2.0 |
| 1350 | 0.470083 | 1.256128 | −97.7 |

TABLE 2

(data of element sample I-2)

| first applying voltage (mV) | TMR ratio (%) | R (Ω) | R variation rate (%) |
|---|---|---|---|
| 100 | 13.7843 | 76.80612 | 0.0 |
| 200 | 13.4641 | 76.01218 | 0.3 |
| 300 | 13.6661 | 75.95178 | 0.2 |
| 400 | 13.8035 | 75.92456 | 0.2 |
| 500 | 13.3896 | 75.88880 | 0.1 |
| 600 | 13.7591 | 75.91357 | 0.1 |
| 650 | 13.7736 | 75.85580 | 0.1 |
| 700 | 13.6752 | 75.78877 | 0.0 |
| 750 | 13.6546 | 75.72928 | −0.1 |
| 800 | 13.5896 | 75.80824 | 0.0 |
| 850 | 13.5546 | 75.83622 | 0.0 |
| 900 | 13.5017 | 75.25860 | −0.7 |
| 950 | 13.5805 | 75.03931 | −1.0 |
| 1000 | 13.5546 | 74.75761 | −1.4 |
| 1050 | 13.6330 | 74.40540 | −1.8 |
| 1100 | 13.6506 | 73.89230 | −2.5 |
| 1150 | 13.6274 | 73.29410 | −3.3 |
| 1200 | 0.4701 | 0.062806 | −99.9 |

Figure 9:
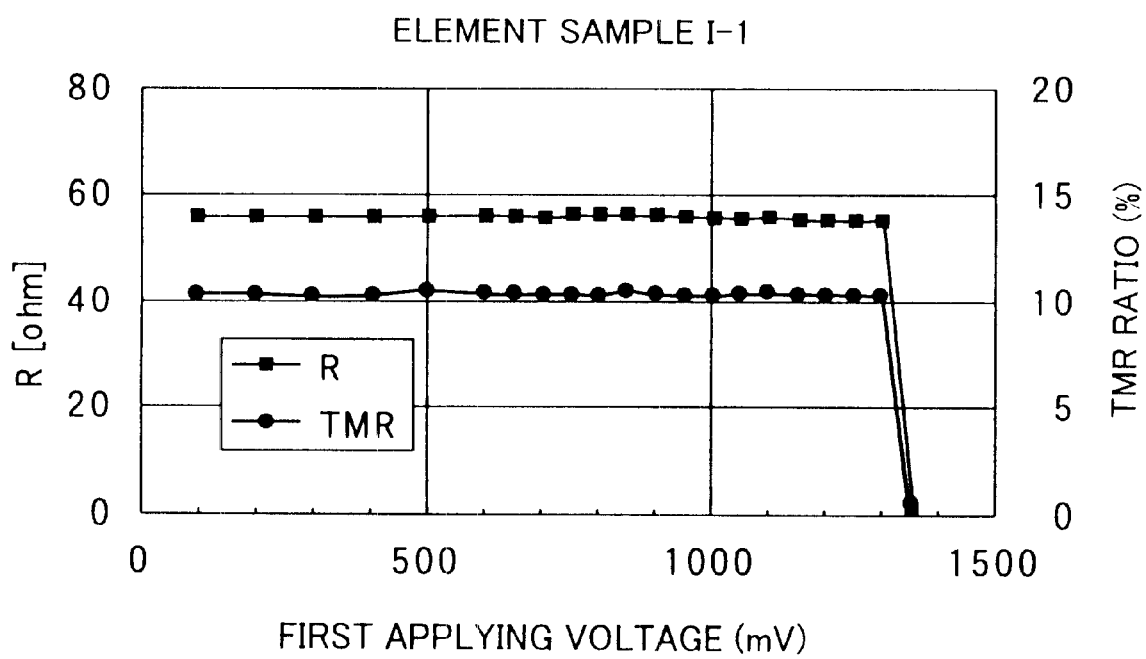
FIG. 9 is a graph corresponding to data in Table 1 for explaining resistance values and TMR rates of an element sample I-1 as a function of a first applying voltage.
Figure 10:
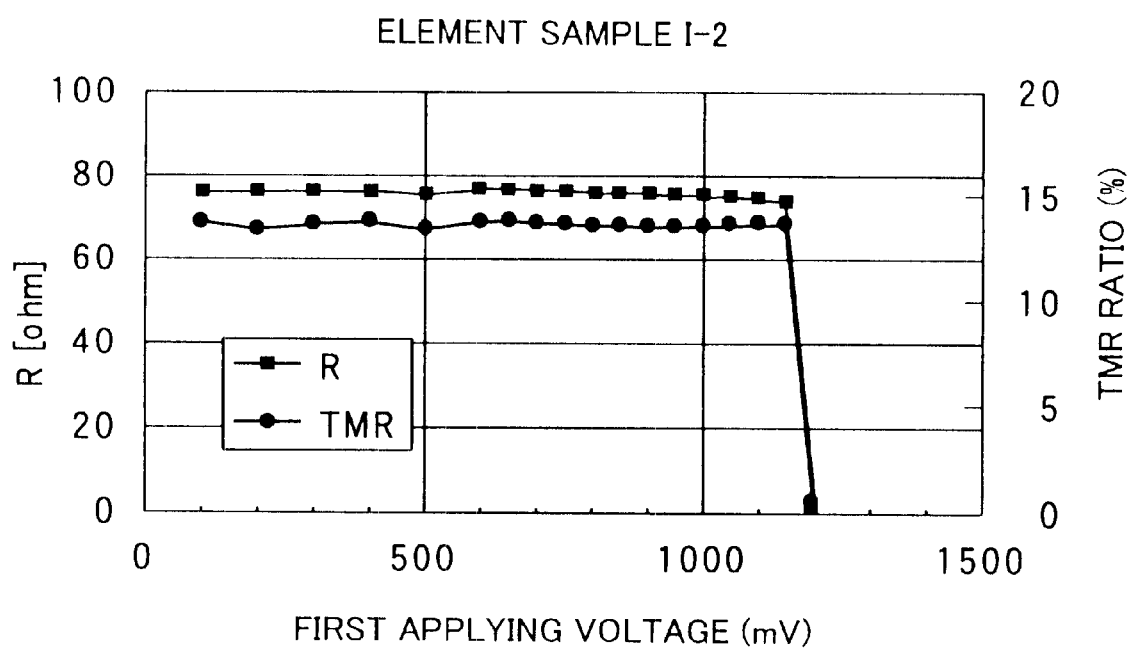
FIG. 10 is a graph corresponding to data in Table 2 for explaining resistance values and TMR rates of an element sample I-2 as a function of a first applying voltage.

The data in Tables 1 and 2 are plotted in FIGS. 9 and 10. From these results, in the element sample I-1, the resistance value was decreased by about 1 (%) at 1000 mV of the applying voltage, showing that the characteristic began to change. Further, the element was destroyed when the applying voltage reached about 1350 mV. In the element sample I-2, the resistance value was decreased by about 1% at 950 mV of the applying voltage, showing that the characteristic began to change. Further, the element was destroyed when the applying voltage reached about 1200 mV.

EXAMPLE II

Samples II-1 to II-18 were prepared according to the design of the samples in the foregoing EXAMPLE I. Since these samples had common design specification, they should have shown identical characteristics, however, in practice, these samples showed different characteristics due to a slight difference in the film construction. For these samples, the tolerance test against the applying voltage was performed as in the EXAMPLE I. As a result, the first applying voltage upon 1% decrease in resistance value (TMR characteristic change voltage), and the first applying voltage upon destruction of the element (TMR breakdown voltage) were defined.

Figure 11:
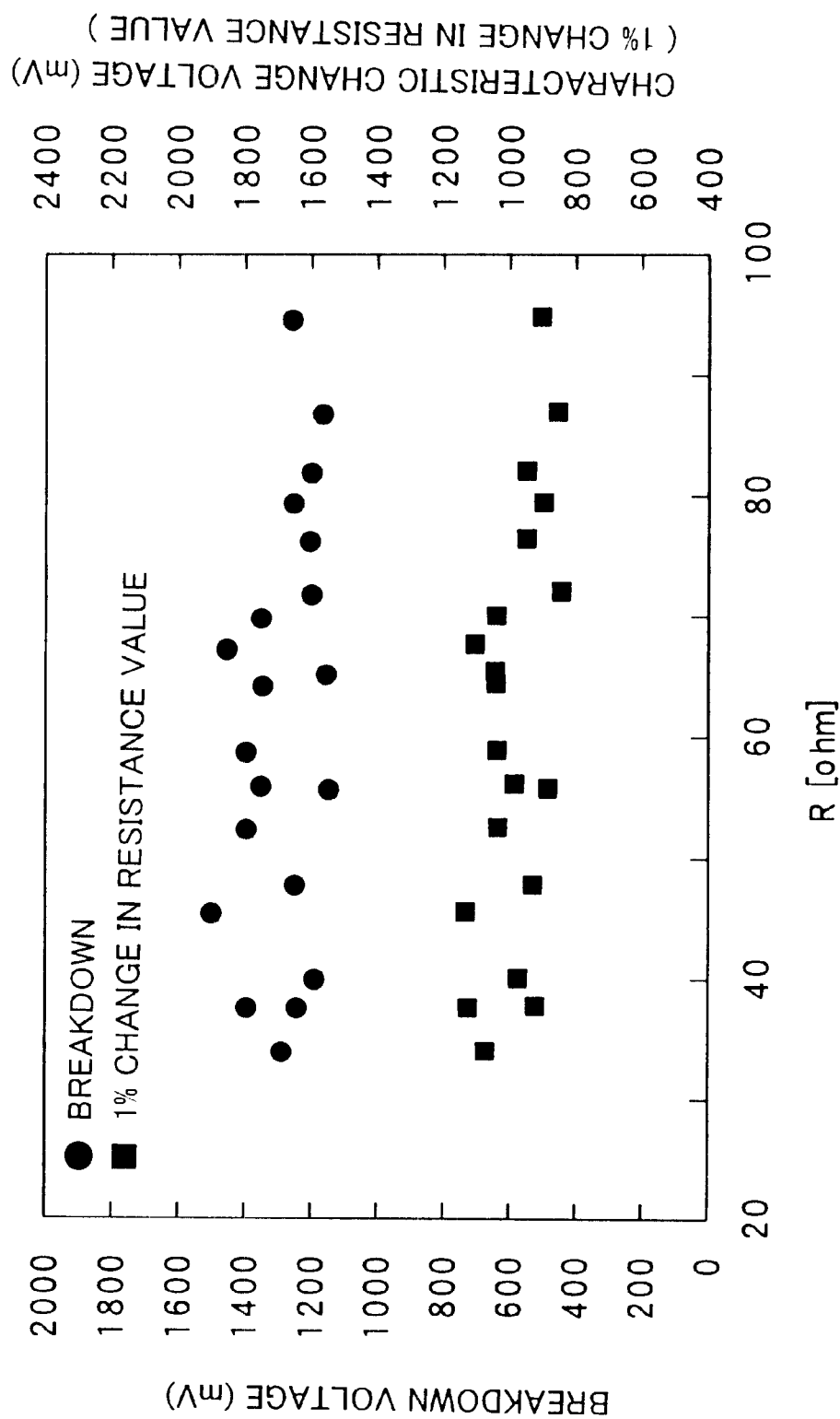
FIG. 11 is a graph totally showing data for sample elements in Table 3, wherein TMR characteristic change voltages and TMR breakdown voltages are plotted with respect to resistance values.

The results are shown in Table 3 below, and the data in Table 3 are plotted in FIG. 11.

TABLE 3

| element sample No. | R0 (Ω) | TMR characteristic change voltage (mV) | TMR breakdown voltage (mV) |
|---|---|---|---|
| I-1 | 55.6 | 1000 | 1350 |
| I-2 | 75.8 | 950 | 1200 |
| II-1 | 64.7 | 1050 | 1150 |
| II-2 | 45.2 | 1150 | 1500 |
| II-3 | 78.9 | 900 | 1250 |
| II-4 | 37.4 | 950 | 1250 |
| II-5 | 52.1 | 1050 | 1400 |
| II-6 | 66.8 | 1100 | 1450 |
| II-7 | 63.8 | 1050 | 1350 |
| II-8 | 71.4 | 850 | 1200 |
| II-9 | 55.3 | 900 | 1150 |
| II-10 | 39.7 | 1000 | 1200 |
| II-11 | 81.5 | 950 | 1200 |
| II-12 | 94.3 | 900 | 1250 |
| II-13 | 33.8 | 1100 | 1300 |
| II-14 | 69.5 | 1050 | 1350 |
| II-15 | 58.5 | 1050 | 1400 |
| II-16 | 37.5 | 1150 | 1400 |
| II-17 | 86.3 | 850 | 1150 |
| II-18 | 47.5 | 950 | 1250 |
| minimum value | | 850 | 1150 |
| standard deviation σ | | 92 | 106 |
| Min − σ | | 758 | 1044 |

R0: resistance value at 100 mV first applying voltage under H = 900 Oe

According to the result of Table 3, so as not to give damage to the element, the first applying voltage is preferably set to 700 mV, and, considering the fact that the resistance value of the element for practical use is in the range of 1 to 300 Ω, it is critical not to supply current greater than 2.3 mA (corresponding to applying voltage 700 mV at 300 Ω) at the beginning of the characteristic measuring. In other words, the initial current value $I_0$ should not exceed 2.3 mA.

EXAMPLE III

According to each of the foregoing first, second, third and fourth embodiments (in the fourth embodiment, n is set to 4), the characteristic measurement of each element shown in Table 3 was implemented. As a result, it was proved that the characteristics of the element could be effectively measured without destroying the element.

From the result described above, the advantageous effect of the present invention is apparently shown. Specifically, the present invention relates to a method for measuring characteristics of a tunnel magnetoresistance effect element having a tunnel multilayered film comprising a tunnel barrier layer and a first and a second ferromagnetic layer formed to sandwich the tunnel barrier layer therebetween, wherein the method comprising the steps of setting an initial current value $I_0$ which does not destroy the element to be measured, measuring, using the initial current value $I_0$, a first resistance value R1 as an approximate resistance value of the element, defining, based on the first resistance value R1 and a voltage value Vs which is a measurement standard for the element, an inspection current value Is (Is=Vs/R1), and measuring characteristics of the element using the inspection current value Is. Therefore, "without damaging or destroying elements" and "in an effective way", the characteristics of the element can be measured.

What is claimed is:

1. A method for measuring characteristics of a tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, wherein said method comprises the steps of:

setting an initial current value $I_0$ which does not destroy the element to be measured;

measuring a first resistance value R1 as an approximate resistance value of the element by applying the current of value $I_0$ in a laminate direction, and defining, based on said first resistance value R1 and a voltage value Vs which is a constant voltage value as a measurement standard for the element, an inspection current value Is (Is=Vs/R1); and measuring the characteristics of the element by applying the current of value $I_s$ in the laminate direction, wherein said initial current value $I_0$ is set to be in the range of 1 μA to 2.3 mA.

2. A method for measuring characteristics of a tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, wherein said method comprises the steps of:

setting an initial current value $I_0$ which does not destroy the element to be measured;

measuring a first resistance value R1 as an approximate resistance value of the element by applying the current of value $I_0$ in a laminate direction, and defining, based on said first resistance value R1 and a voltage value Vs which is a constant voltage value as a measurement standard for the element, a first modified current value $I_1$ ($I_1$=Vs/R1);

measuring a second resistance value R2 as an approximate resistance value of the element by applying the current of value $I_1$ in the laminate direction, and defining, based on said second resistance value R2 and the voltage value Vs which is the constant voltage value as the measurement standard for the element, an inspection current value Is (Is=Vs/R2); and measuring the characteristics of the element by applying the current of value $I_s$ in the laminate direction, wherein said initial current value $I_0$ is set to be in the range of 1 μA to 2.3 mA.

3. A method for measuring characteristics of a tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, wherein said method comprises the steps of:

setting an initial current value $I_0$ which does not destroy the element to be measured;

measuring a first resistance value R1 as an approximate resistance value of the element by applying the current of value $I_0$ in a laminate direction, and defining, based on said first resistance value R1 and a voltage value Vs which is a constant voltage value as a measurement standard for the element, a first modified current value $I_1$ ($I_1$=Vs/R1);

measuring a second resistance value R2 as an approximate resistance value of the element by applying the current of value $I_1$ in the laminate direction, and defining, based on said second resistance value R2 and the voltage value Vs which is the constant voltage value as the measurement standard for the element, a second modified current value $I_2$ ($I_2$=Vs/R2);

measuring a third resistance value R3 as an approximate resistance value of the element by applying the current of value $I_2$ in the laminate direction, and defining, based on said third resistance value R3 and the voltage value Vs which is the constant voltage value as the measurement standard for the element, an inspection current value Is (Is=Vs/R3); and measuring the characteristics of the element by applying the current of value $I_s$ in the laminate direction, wherein said initial current value $I_0$ is set to be in the range of 1 μA to 2.3 mA.

4. A method for measuring characteristics of a tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, wherein said method comprises the steps of:

(1) setting an initial current value $I_0$ which does not destroy the element to be measured;

(2) measuring a first resistance value R1 as an approximate resistance value of the element by applying the current of value $I_0$ in a laminate direction, and defining, based on said first resistance value R1 and a voltage value Vs which is a constant voltage value as a measurement standard for the element, a first modified current value $I_1$ ($I_1$=Vs/R1);

(3) measuring a second resistance value R2 as an approximate resistance value of the element by applying the current of value $I_1$ in the laminate direction, and defining, based on said second resistance value R2 and the voltage value Vs which is the constant voltage value as the measurement standard for the element, a second modified current value $I_2$ ($I_2$=VS/R2);

(4) measuring a third resistance value R3 as an approximate resistance value of the element by applying the current of value $I_2$ in the laminate direction, and defining, based on said third resistance value R3 and the voltage value Vs which is the constant voltage value as the measurement standard for the element, a third modified current value $I_3$ ($I_3$=Vs/R3);

(5) repeating a step which is substantially identical to the step (4) so as to measure a $(n+1)^{th}$ resistance value Rn+1 as an approximate resistance value of the element by applying a $n^{th}$ modified current of value $I_n$ (wherein n is an integer greater than or equal to 4) in the laminate direction, and defining, based on said $(n+1)^{th}$ resistance value Rn+1 and the voltage value Vs which is the constant voltage value as the measurement standard for the element, an inspection current value Is (Is=Vs/Rn+1); and (6) measuring the characteristics of the element by applying the current of value $I_s$ in the laminate direction, wherein said initial current value $I_0$ is set to be in the range of 1 μA to 2.3 mA.

5. An apparatus for measuring characteristics of a tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, said apparatus having a processing circuit which is capable of measuring characteristics of said element while supplying a sense current in a lamination direction of the tunnel multilayered film for applying a given voltage, wherein said processing circuit measures a first resistance value R1 as an approximate resistance value of the element by applying the current of value $I_0$ in the laminate direction which is set not to destroy the element to be measured, defines, based on said first resistance value R1 and a voltage value Vs which is a constant voltage value as a measurement standard for the element, an inspection current value Is (Is=Vs/R1), and measures characteristics of the element by applying the current of value $I_s$ in the laminate direction, and wherein said initial current value $I_0$ is set to be in the range of 1 μA to 2.3 mA.

6. An apparatus for measuring characteristics of a tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, said apparatus having a processing circuit which is capable of measuring characteristics of said element while supplying a sense current in a lamination direction of the tunnel multilayered film for applying a given voltage, wherein said processing circuit measures a first resistance value R1 as an approximate resistance value of the element by applying the current of value $I_0$ in the laminate direction which is set not to destroy the element to be measured, and defines, based on said first resistance value R1 and a voltage value Vs which is a constant voltage value as a measurement standard for the element, a first modified current value $I_1$ ($I_1$=Vs/R1);

measures a second resistance value R2 as an approximate resistance value of the element by applying the current of value $I_1$ in the laminate direction, and defines, based on said second resistance value R2 and the voltage value Vs which is the constant voltage value as the measurement standard for the element, an inspection current value Is (Is=Vs/R2); and measures the characteristics of the element by applying the current of value $I_s$ in the laminate direction, and wherein said initial current value $I_0$ is set to be in the range of 1 μA to 2.3 mA.

7. An apparatus for measuring characteristics of a tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, said apparatus having a processing circuit which is capable of measuring characteristics of said element while supplying a sense current in a lamination direction of the tunnel multilayered film for applying a given voltage, wherein said processing circuit measures a first resistance value R1 as an approximate resistance value of the element by applying the current of value $I_0$ in the laminate direction, and defines, based on said first resistance value R1 and a voltage value Vs which is a constant voltage value as a measurement standard for the element, a first modified current value $I_1$ ($I_1$=Vs/R1);

measures a second resistance value R2 as an approximate resistance value of the element by applying the current of value $I_1$ in the laminate direction, and defines, based on said second resistance value R2 and the voltage value Vs which is the constant voltage value as the measurement standard for the element, a second modified current value $I_2$ ($I_2$=Vs/R2);

measures a third resistance value R3 as an approximate resistance value of the element by applying the current of value $I_2$ in the laminate direction, and defines, based on said second resistance value R3 and the voltage value Vs which is the constant voltage value as the measurement standard for the element, an inspection current value Is (Is=Vs/R3); and measures the characteristics of the element by applying the current of value $I_s$ in the laminate direction, and wherein said initial current value $I_0$ is set to be in the range of 1 μA to 2.3 mA.

8. An apparatus for measuring characteristics of a tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, said apparatus having a processing circuit which is capable of measuring characteristics of said element while supplying a sense current in a lamination direction of the tunnel multilayered film for applying a given voltage, wherein said processing circuit (1) measures a first resistance value R1 as an approximate resistance value of the element by applying the current of value $I_0$ in the laminate direction which is set not to destroy the element to be measured, and defines, based on said first resistance value R1 and a voltage value Vs which is a constant voltage value as a measurement standard for the element, a first modified current value $I_1$ ($I_1$=Vs/R1);

(2) measures a second resistance value R2 as an approximate resistance value of the element by applying the current of value $I_1$ in the laminate direction, and defines, based on said second resistance value R2 and the voltage value Vs which is the constant voltage value as the measurement standard for the element, a second modified current value $I_2$ ($I_2$=Vs/R2);

(3) measures a third resistance value R3 as an approximate resistance value of the element by applying the current of value $I_2$ in the laminate direction, and defines, based on said second resistance value R3 and the voltage value Vs which is the constant voltage value as the measurement standard for the element, a third modified current value $I_3$ ($I_3$=Vs/R3); and (4) repeats a step which is substantially identical to the step (3) so as to measure a $(n+1)^{th}$ resistance value Rn+1 as an approximate resistance value of the element by applying a $n^{th}$ modified current of value $I_n$ in the laminate direction (wherein n is an integer greater than or equal to 4), and defines, based on said $(n+1)^{th}$ resistance value Rn+1 and the voltage value Vs which is the constant voltage value as the measurement standard for the element, an inspection current value Is (Is=Vs/Rn+1); and (5) measures the characteristics of the element by applying the current of value $I_s$ in the laminate direction, and wherein said initial current value $I_0$ is set to be in the range of 1 µA to 2.3 mA.

9. A hard disk drive having, at a tip of a suspension, a tunnel magnetoresistance effect element for deriving a magnetic signal from a magnetic recording hard disk, said tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, said hard disk drive having a processing circuit which is capable of deriving a magnetic signal while supplying a sense current in a lamination direction of the tunnel multilayered film for applying a given voltage, wherein said processing circuit measures a first resistance value R1 as an approximate resistance value of the element by applying the current of value $I_0$ in the laminate direction which is set not to destroy the element to be measured, and defines, based on said first resistance value R1 and a voltage value Vs which is a constant voltage value as a measurement standard for the element, a sense current value Ise (Ise=Vs/R1); and derives a magnetic signal by applying the current of value Ise in the laminate direction, and wherein said initial current value $I_0$ is set to be in the range of 1 µA to 2.3 mA.

10. A hard disk drive having, at a tip of a suspension, a tunnel magnetoresistance effect element for deriving a magnetic signal from a magnetic recording hard disk, said tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, said hard disk drive having a processing circuit which is capable of deriving a magnetic signal while supplying a sense current in a lamination direction of the tunnel multilayered film for applying a given voltage, wherein said processing circuit measures a first resistance value R1 as an approximate resistance value of the element by applying the current of value $I_0$ in the laminate direction which is set not to destroy the element to be measured, and defines, based on said first resistance value R1 and a voltage value Vs which is a constant voltage value as a measurement standard for the element, a first modified current value $I_1$ ($I_1$=Vs/R1);

measures a second resistance value R2 as an approximate resistance value of the element by applying the current of value $I_1$ in the laminate direction, and defines, based on said second resistance value R2 and the voltage value Vs which is the constant voltage value as the measurement standard for the element, a sense current Ise (Ise=Vs/R2); and derives a magnetic signal by applying the current of value Ise in the laminate direction, and wherein said initial current value $I_0$ is set to be in the range of 1 µA to 2.3 mA.

11. A hard disk drive having, at a tip of a suspension, a tunnel magnetoresistance effect element for deriving a magnetic signal from a magnetic recording hard disk, said tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, said hard disk drive having a processing circuit which is capable of deriving a magnetic signal while supplying a sense current in a lamination direction of the tunnel multilayered film for applying a given voltage, wherein said processing circuit measures a first resistance value R1 as an approximate resistance value of the element by applying the current of value $I_0$ in the laminate direction which is set not to destroy the element to be measured, and defines, based on said first resistance value R1 and a voltage value Vs which is a constant voltage value as a measurement standard for the element, a first modified current value $I_1$ ($I_1$=Vs/R1);

measures a second resistance value R2 as an approximate resistance value of the element by applying the current of value $I_1$ in the laminate direction, and defines, based on said second resistance value R2 and the voltage value Vs which is the constant voltage value as the measurement standard for the element, a second modified current $I_2$ ($I_2$=Vs/R2);

measures a third resistance value R3 as an approximate resistance value of the element by applying the current of value $I_2$ in the laminate direction, and defines, based on said third resistance value R3 and the voltage value Vs which is the constant voltage value as the measurement standard for the element, a sense current value Ise (Ise=Vs/R3); and derives a magnetic signal by applying the current of value Ise in the laminate direction, and wherein said initial current value $I_0$ is set to be in the range of 1 µA to 2.3 mA.

12. A hard disk drive having, at a tip of a suspension, a tunnel magnetoresistance effect element for deriving a magnetic signal from a magnetic recording hard disk, said tunnel magnetoresistance effect element having a tunnel multilayered film comprising a tunnel barrier layer which is a thin insulation film which allows electrons to pass therethrough while keeping spins of the electrons due to the tunnel magnetoresistance effect and a first and a second ferromagnetic layer formed to sandwich said tunnel barrier layer therebetween, said hard disk drive having a processing circuit which is capable of deriving a magnetic signal while supplying a sense current in a lamination direction of the tunnel multilayered film for applying a given voltage, wherein said processing circuit (1) measures a first resistance value R1 as an approximate resistance value of the element by applying the current of value $I_0$ in the laminate direction which is set not to destroy the element to be measured, and defines, based on said first resistance value R1 and a voltage value Vs which is a constant voltage value as a measurement standard for the element, a first modified current value $I_1$ ($I_1$=Vs/R1);

(2) measures a second resistance value R2 as an approximate resistance value of the element by applying the current of value $I_1$ in the laminate direction, and defines, based on said second resistance value R2 and the voltage value Vs which is the constant voltage value as the measurement standard for the element, a second modified current $I_2$ ($I_2$=Vs/R2);

(3) measures a third resistance value R3 as an approximate resistance value of the element by applying the current of value $I_2$ in the laminate direction, and defines, based on said third resistance value R3 and the voltage value Vs which is the constant voltage value as the measurement standard for the element, a third modified current value $I_3$ ($I_3$=Vs/R3); and (4) repeats a step which is substantially identical to the step (3) so as to measure a $(n+1)^{th}$ resistance value Rn+1 as an approximate resistance value of the element by applying a $n^{th}$ modified current of value $I_n$ in the laminate direction (wherein n is an integer greater than or equal to 4), and defines, based on said $(n+1)^{th}$ resistance value Rn+1 and the voltage value Vs which is the constant voltage value as the measurement standard for the element, a sense current value Ise (Ise=Vs/Rn+1); and (5) derives a magnetic signal by applying the current of value Ise in the laminate direction, and
wherein said initial current value $I_0$ is set to be in the range of 1 $\mu$A to 2.3 mA.

* * * * *